United States Patent

Jang

[11] Patent Number: 6,037,236
[45] Date of Patent: Mar. 14, 2000

[54] REGENERATION OF ALIGNMENT MARKS AFTER SHALLOW TRENCH ISOLATION WITH CHEMICAL MECHANICAL POLISHING

[75] Inventor: Syun-Ming Jang, Hsin-Chu, Taiwan

[73] Assignee: Taiwan Semiconductor Manufacturing Company, Hsin-Chu, Taiwan

[21] Appl. No.: 09/135,045

[22] Filed: Aug. 17, 1998

[51] Int. Cl.[7] ............................................ H01L 21/76
[52] U.S. Cl. ..................... 438/401; 438/692; 438/697; 438/700
[58] Field of Search ................... 438/690, 691, 438/692, 694, 697, 700, 702, 424, 427, 401, 975

[56] References Cited

U.S. PATENT DOCUMENTS

| | | | |
|---|---|---|---|
| 5,229,316 | 7/1993 | Lee et al. | 437/67 |
| 5,310,691 | 5/1994 | Suda | 437/31 |
| 5,401,691 | 3/1995 | Caldwell | 437/228 |
| 5,783,490 | 7/1998 | Tseng | 438/692 |
| 5,786,260 | 7/1998 | Jang et al. | 438/401 |
| 5,897,371 | 4/1999 | Yeh et al. | 438/633 |
| 5,950,093 | 9/1999 | Wei | 438/401 |
| 5,963,816 | 10/1999 | Wang et al. | 438/401 |

*Primary Examiner*—Benjamin L. Utech
*Assistant Examiner*—Kin-Chan Chen
*Attorney, Agent, or Firm*—George O. Saile; Stephen B. Ackerman; Larry J. Prescott

[57] ABSTRACT

A method of preserving alignment marks in integrated circuit substrates using shallow trench isolation after planarization using chemical mechanical polishing. A layer of silicon nitride is formed on the substrate and openings defining alignment trenches and isolation trenches are etched in the silicon nitride layer. Alignment trenches are formed in auxiliary alignment regions of the substrate and isolation trenches are formed in the active region of the substrate during the same process step using the openings in the silicon nitride layer as a mask. A layer of dielectric is then deposited on the substrate filling the alignment trenches. The dielectric is then etched back and the substrate is planarized. That part of the silicon nitride layer in the auxiliary region of the substrate is then etched away leaving dielectric in the alignment trenches extending a step height above the substrate surface. The dielectric in the alignment trenches form auxiliary alignment marks which will be preserved during subsequent processing steps.

29 Claims, 7 Drawing Sheets

FIG. 11

REGENERATION OF ALIGNMENT MARKS AFTER SHALLOW TRENCH ISOLATION WITH CHEMICAL MECHANICAL POLISHING

BACKGROUND OF THE INVENTION (1) Field of the Invention

This invention relates to methods of preserving alignment marks in integrated circuit substrates and more particularly to preserving alignment marks in methods using shallow trench isolation and chemical mechanical polishing.

(2) Description of the Related Art

U.S. Pat. No. 5,401,691 to Caldwell describes a method of forming an alignment mark during semiconductor device manufacturing. The method uses a first area and a second area provided on a semiconductor substrate with the first area adjacent to the second area. The invention describes the formation of an alignment mark using an inverse open frame.

U.S. Pat. No. 5,310,691 to Suda describes the formation of a concave or convex step formed on the surface of the epitaxial layer in a boundary between the memory cell region of an integrated circuit element and the peripheral circuit region of the integrated circuit element. The concave or convex step is used as an alignment mark in a later processing step.

U.S. Pat. No. 5,229,316 to Lee et al. describes a method of forming isolation trenches to provide device isolation in integrated circuit elements.

A Patent Application TSMC-97-265 Ser. No. 09/067,262; Filed Apr. 27, 1998, pending; entitled "METHOD OF PHOTO ALIGNMENT FOR SHALLOW TRENCH ISOLATION WITH CHEMICAL MECHANICAL POLISHING" and assigned to the same assignee describes methods of preserving alignment marks in integrated circuit substrates.

SUMMARY OF THE INVENTION

Shallow trench isolation is often used to provide isolation between various parts of the active region of a semiconductor integrated circuit wafer. In shallow trench isolation trenches are formed in the active region of the wafer and a layer of dielectric, such as silicon dioxide, is then formed on the wafer filling the isolation trenches. The wafer is then planarized using a means such as chemical mechanical polishing. Any subsequent deposition of a layer or layers of opaque material, such as the deposition of a layer of metal for the formation of electrodes, can obscure the alignment marks and render them useless. Unless care is taken the alignment marks used to align masks to the wafer can be lost after the deposition of such layers of opaque material. Preserving the alignment marks on a semiconductor wafer after chemical mechanical polishing is critical to maintaining mask alignment for those steps which follow the chemical mechanical polishing.

Figure 1A:
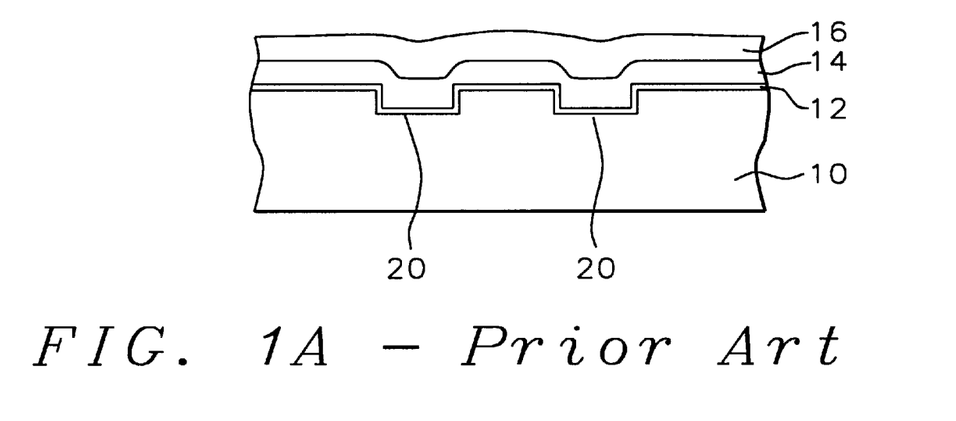
FIG. 1A shows a cross section view of a primary alignment region of a wafer after layers of pad oxide, silicon nitride, and dielectric have been deposited.
Figure 1B:
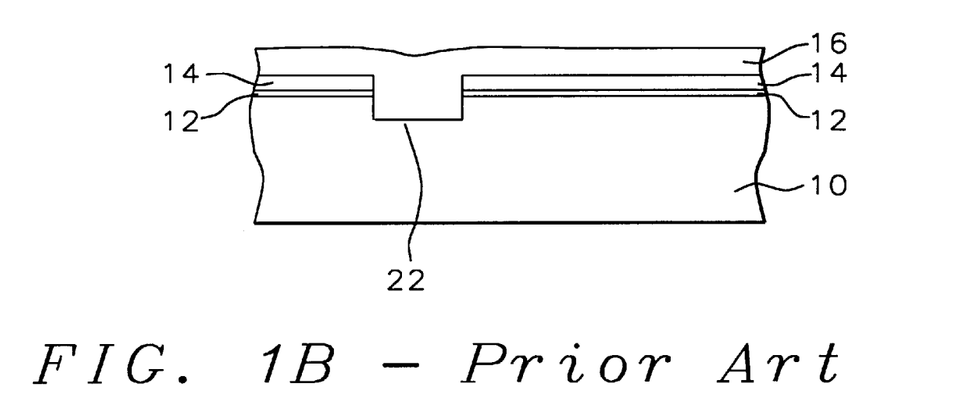
FIG. 1B shows a cross section view of a part of the active region of a wafer after layers of pad oxide and silicon nitride have been deposited, an isolation trench has been formed, and a layer of dielectric has been deposited.

The problem encountered in maintaining the alignment marks is illustrated in FIGS. 1A–2B. FIG. 1A shows a cross section of alignment marks 20 in a wafer 10 and FIG. 1B shows a cross section of a part of the active region of the wafer 10 having an isolation trench 22. As shown in FIG. 1A, the alignment marks 20 are formed in the wafer 10 before wafer processing begins. A layer of pad oxide 12 is then formed on the wafer 10 followed by a layer of silicon nitride 14 formed on the layer of pad oxide 12. As shown in FIG. 1B openings are formed in the layer of silicon nitride 14 using the alignment marks to locate the proper location of the openings. Using the openings in the layer of silicon nitride 14 as a mask openings are formed in the layer of pad oxide 12 and isolation trenches 20 are formed in the wafer 10. A layer of dielectric 16, such as silicon dioxide, is then deposited on the wafer filling the isolation trenches 22, FIG. 1B, and also covering the alignment marks 20, FIG. 1A.

Figure 2A:
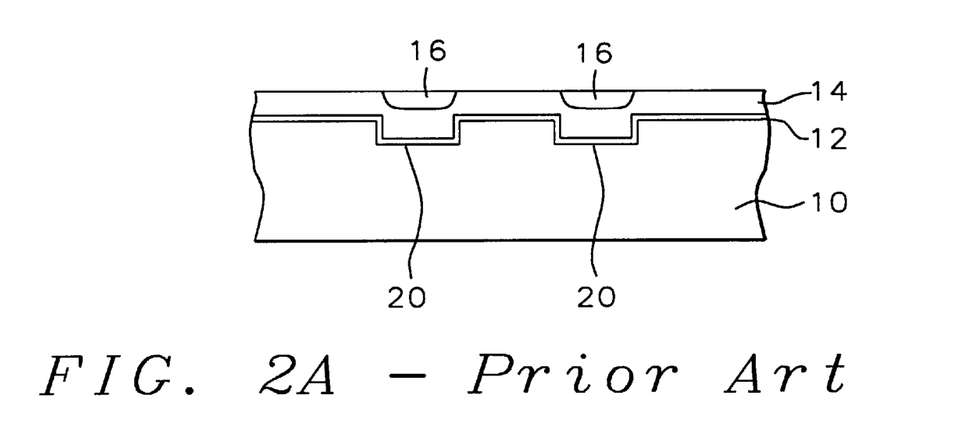
FIG. 2A shows a cross section view of the primary alignment region of FIG. 1A after the wafer has been planarized.
Figure 2B:
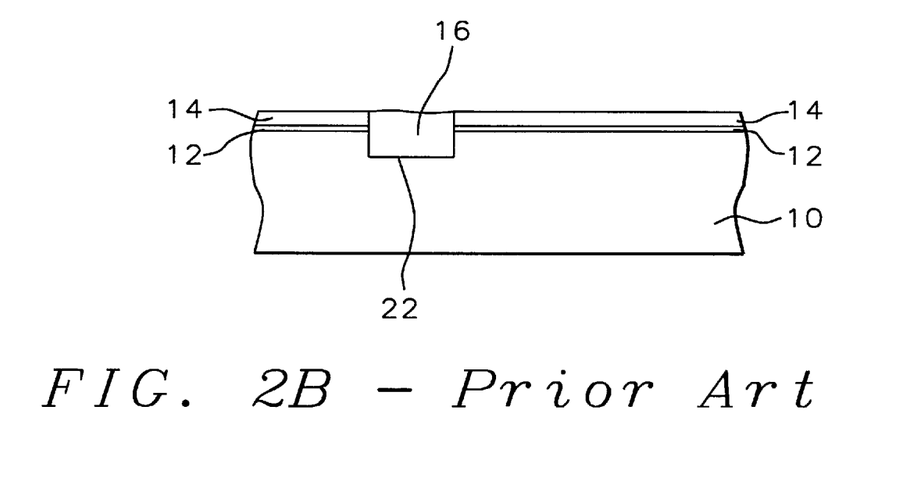
FIG. 2B shows a cross section view of the portion of the active region of FIG. 1B after the wafer has been planarized.

As shown in FIGS. 2A and 2B the wafer is then planarized using etchback of the layer of dielectric 16 followed by chemical mechanical polishing leaving dielectric 16 in the isolation trenches 22, see FIG. 2A, as well as the alignment marks 20, see FIG. 2B. Since the wafer has been planarized the subsequent deposition of opaque material will obscure the alignment marks and make them undetectable.

It is a principle objective of this invention to provide a method of preserving alignment marks after deposition of a layer of dielectric on a wafer and planarizing the wafer.

It is another principle objective of this invention to provide a method of preserving alignment marks during and after the steps of forming isolation trenches, filling the trenches with dielectric, planarization of the wafer after filling the trenches with dielectric, and deposition of a layer of opaque material on the planarized wafer.

These objectives are achieved by forming a layer of silicon nitride having a first thickness on the wafer before the isolation trenches are formed. Alignment trenches are then formed in an alignment region of the wafer, such as a scribe line region, at the same time the isolation trenches are formed in the active region of the wafer using the base alignment marks in the wafer to align the alignment trenches and isolation trenches to the wafer. A layer of dielectric having a second thickness is then formed on the wafer filling the isolation trenches and the alignment trenches with dielectric. The second thickness is at least twice the width of the alignment trenches so that the alignment trenches are completely filled with dielectric.

The wafer is then planarized thereby removing that part of the layer of dielectric above the plane of the top surface of the layer of silicon nitride using etchback of the dielectric followed by chemical mechanical polishing of the wafer. The silicon nitride is then removed from the alignment region of the wafer leaving dielectric material in the alignment trenches extending a step height equal to the first thickness above the top surface of the wafer thereby forming dielectric alignment marks. This step height allows the dielectric alignment marks to be detected during later processing steps.

DESCRIPTION OF THE PREFERRED EMBODIMENTS

Figure 3:
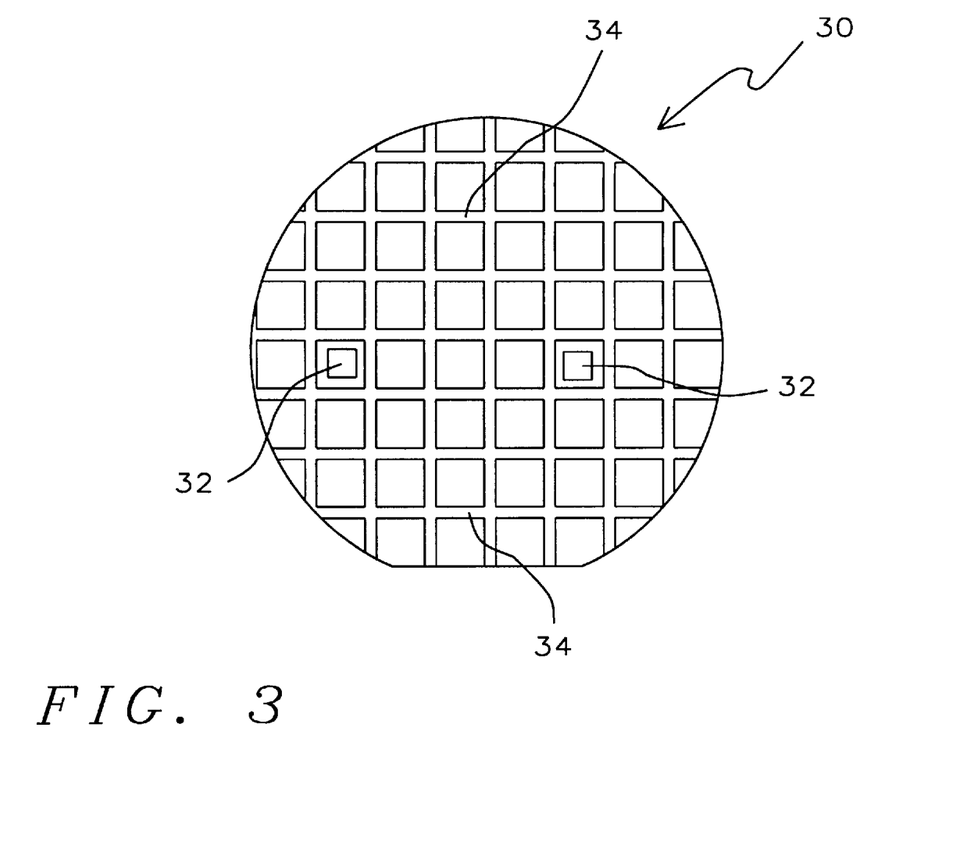
FIG. 3 shows a cross section view of a part of a wafer after a layer of pad oxide has been formed on the wafer and a layer of silicon nitride has been formed on the layer of pad oxide.

Refer now to FIGS. 3–10 for a description of the preferred embodiments of this invention. In order to form the auxiliary alignment marks of this invention auxiliary alignment regions are set aside on the substrate or integrated circuit wafer. These auxiliary alignment regions can be located anywhere on the wafer and in this example are located on the scribe lines 34, see FIG. 3, so that no useful area of the active region of the wafer is lost. FIG. 3 shows a top view of an integrated circuit wafer 30 having two regions 32 for the primary alignment marks and scribe lines 34 where the auxiliary alignment regions are to be placed.

Figure 4:
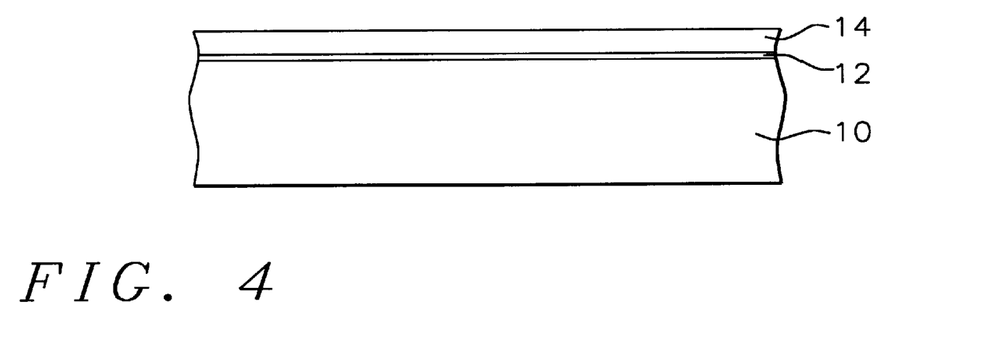
FIG. 4 shows a top view of an integrated circuit wafer.
Figure 5A:
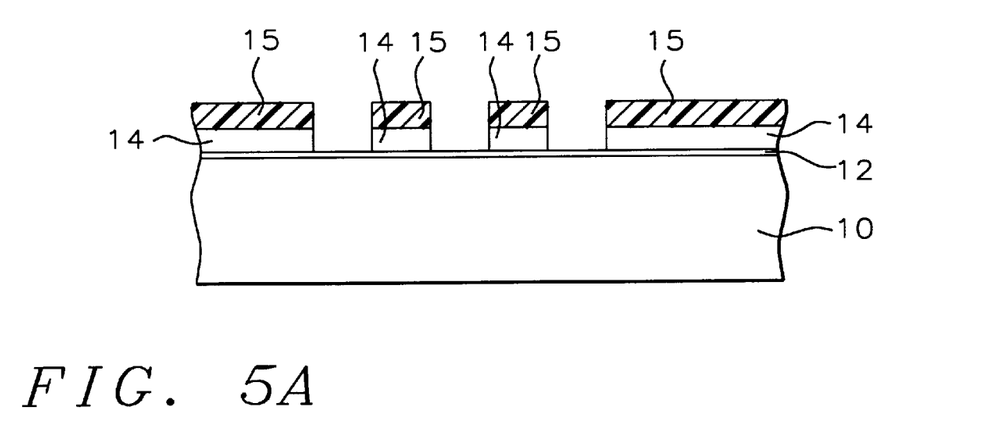
FIG. 5A shows a cross section view of part of an auxiliary alignment region of this invention after alignment openings have been formed in the layer of silicon nitride.
Figure 5B:
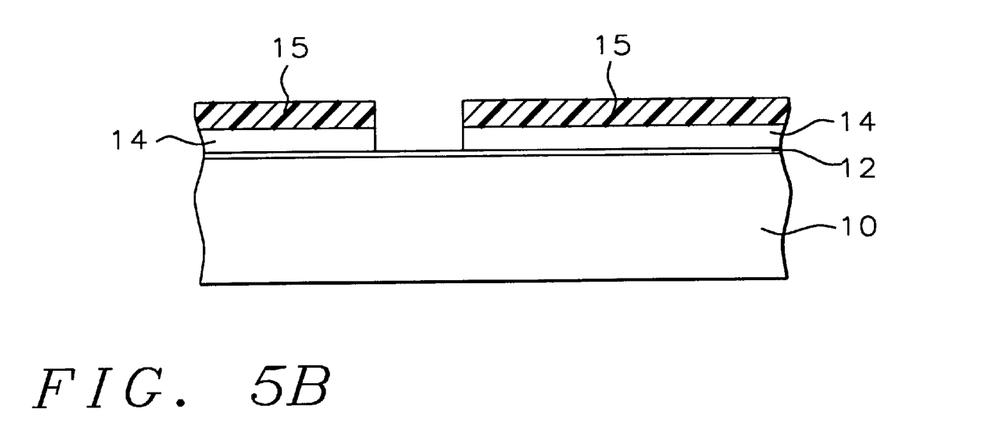
FIG. 5B shows a cross section view of part of the active region of the wafer after isolation openings have been formed in the layer of silicon nitride.

FIG. 4 shows a cross section of a substrate 10, such as a silicon integrated circuit wafer, having a top surface. A layer of pad oxide 12 is formed on the top surface of the substrate 10. In this example the pad oxide is a layer of silicon oxide having a thickness of between about 100 and 120 Angstroms. A layer of silicon nitride, $Si_3N_4$, having a thickness of between about 1700 and 1800 Angstroms is formed on the layer of pad oxide 12. Next, as shown in FIGS. 5A and 5B a patterned layer of photoresist 15 having openings for the alignment trenches and isolation trenches is formed on the layer of silicon nitride 14. Openings for the alignment trenches and the isolation trenches are then formed in the layer of silicon nitride 14 using the patterned layer of photoresist 15 as a mask. FIG. 5A shows a cross section view of an auxiliary alignment region showing three openings in the photoresist 15 and in the silicon nitride layer 14 for alignment trenches. FIG. 5B shows a cross section view of part of the active region of the wafer showing an opening in the layer of photoresist 15 and in the layer of silicon nitride 14 for an isolation trench.

Figures 6A, 6B:
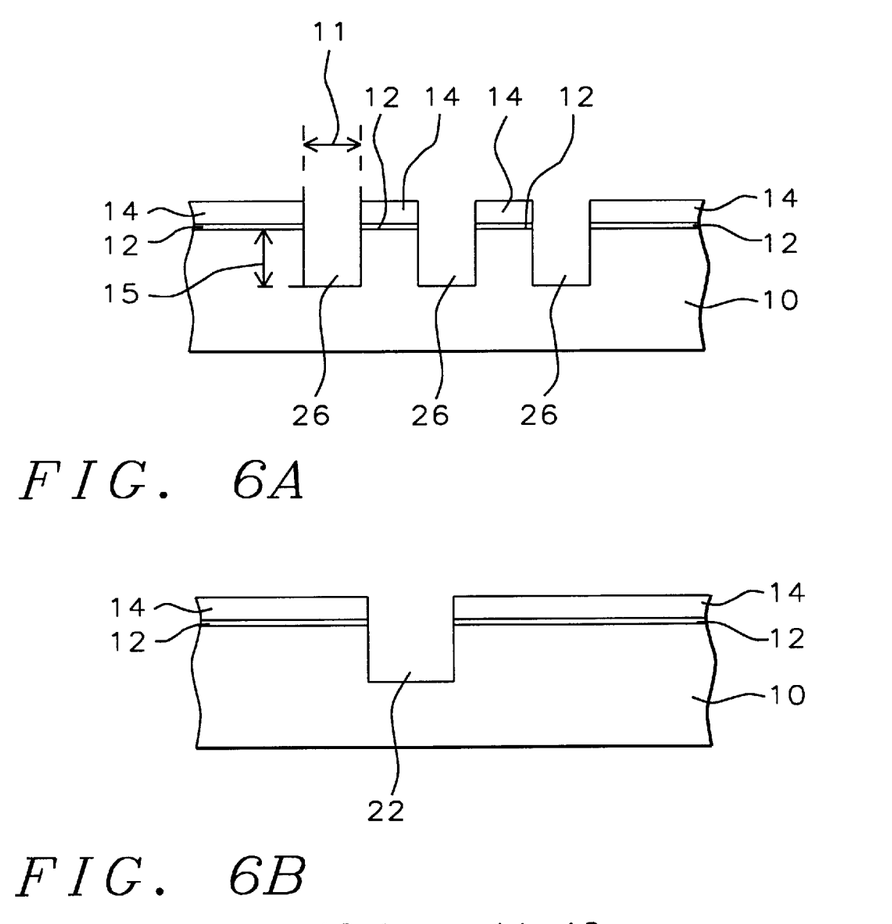
FIG. 6A shows a cross section view of the part of the auxiliary alignment region of the wafer of FIG. 5A after alignment trenches have been formed in the wafer.
FIG. 6B shows a cross section view of the part of the active region of the wafer of FIG. 5B after isolation trenches have been formed in the wafer.

Next, as shown in FIG. 6A, the patterned layer of photoresist is stripped and openings are formed in the layer of pad oxide 12 and alignment trenches 26, having a depth 15 and a width 11, are formed in the substrate 10 using the patterned layer of silicon nitride 14 as a mask. Alternatively, the patterned layer of photoresist is left in place and openings are formed in the layer of pad oxide 12 and alignment trenches 26, having a depth 15 and a width 11, are formed in the substrate 10 using the patterned layer of photoresist and the patterned layer of silicon nitride 14 as a mask. The patterned layer of photoresist is then stripped. As shown in FIG. 6B an opening is formed in the layer of pad oxide and an isolation trench 22 is formed in the substrate using the patterned layer of silicon nitride 14 as a mask. The alignment trenches 26 and the isolation trench 22 are formed during the same processing steps. The depth 15 of the alignment trenches is between about 2800 and 4200 Angstroms.

Figure 7A:
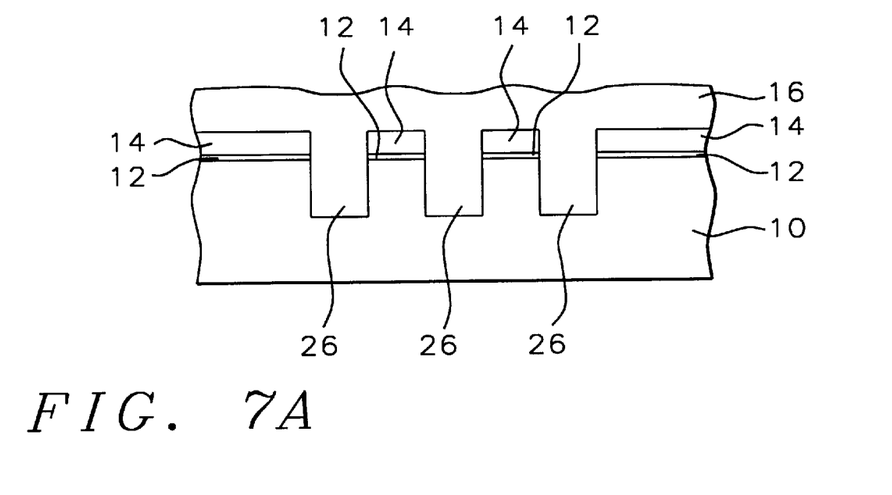
FIG. 7A shows a cross section view of the part of the auxiliary alignment region of the wafer of FIG. 6A after a layer of dielectric has been deposited filling the alignment trenches.
Figure 7B:
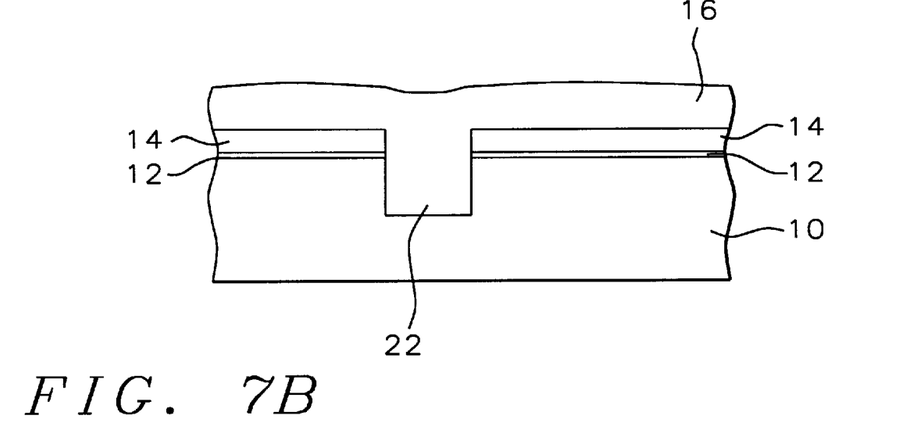
FIG. 7B shows a cross section view of the part of the active region of the wafer of FIG. 6B after a layer of dielectric has been deposited filling the isolation trenches.

As shown in FIGS. 7A and 7B, a layer of dielectric 16 having a first thickness is then formed on the wafer so that dielectric fills the alignment trenches as well as the isolation trenches. The first thickness is determined by the depth of the alignment trenches and must be at least one half the width 11, see FIG. 6A, of the alignment trenches or greater so that the dielectric 16 completely fills the alignment trenches 26. In this example the dielectric is silicon dioxide having a thickness of between about 5000 and 7000 Angstroms and deposited using low pressure chemical vapor deposition of tetraethyl orthosilicate or chemical vapor deposition of ozone and tetraethyl orthosilicate.

Figure 8A:
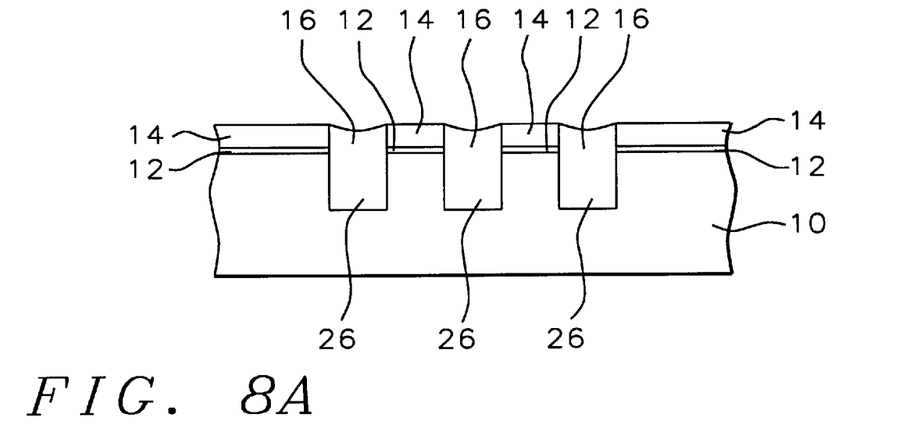
FIG. 8A shows a cross section view of the part of the auxiliary alignment region of the wafer of FIG. 7A after the layer of dielectric has been etched back.
Figure 8B:
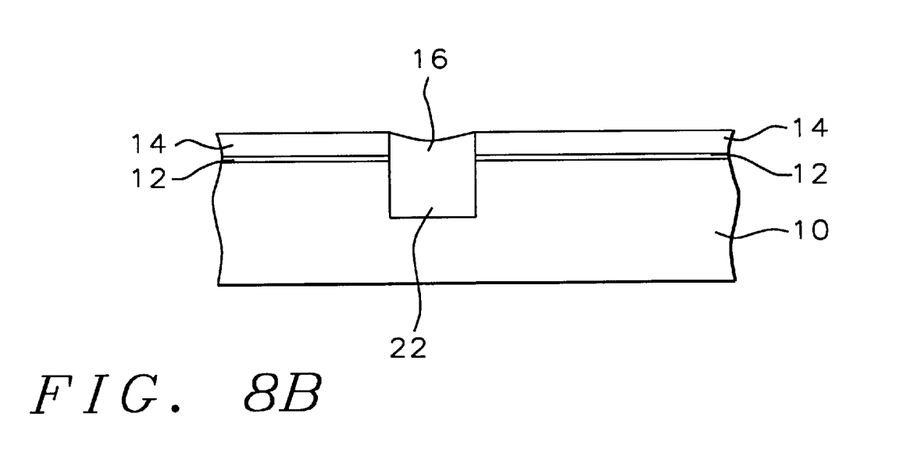
FIG. 8B shows a cross section view of the part of the active region of the wafer of FIG. 7B after the layer of dielectric has been etched back.
Figure 9A:
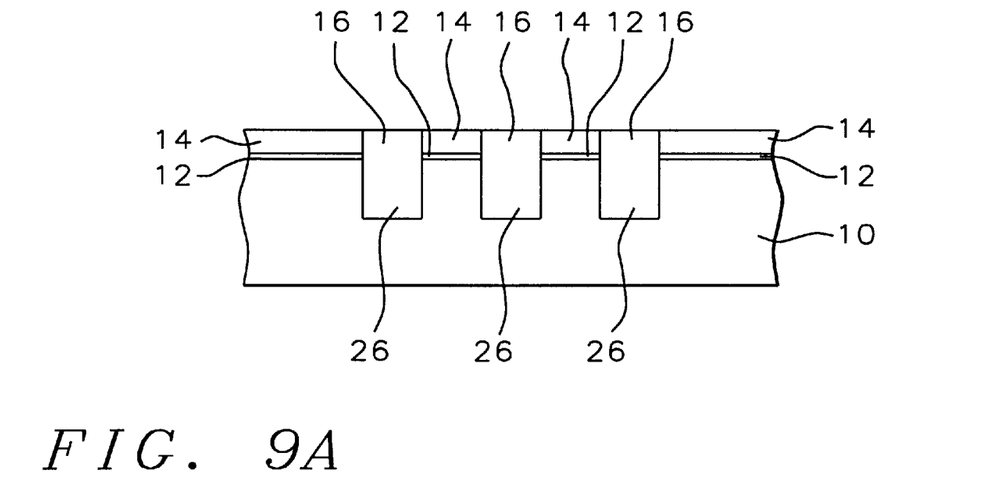
FIG. 9A shows a cross section view of the part of the auxiliary alignment region of the wafer of FIG. 8A after the substrate has been planarized.
Figure 9B:
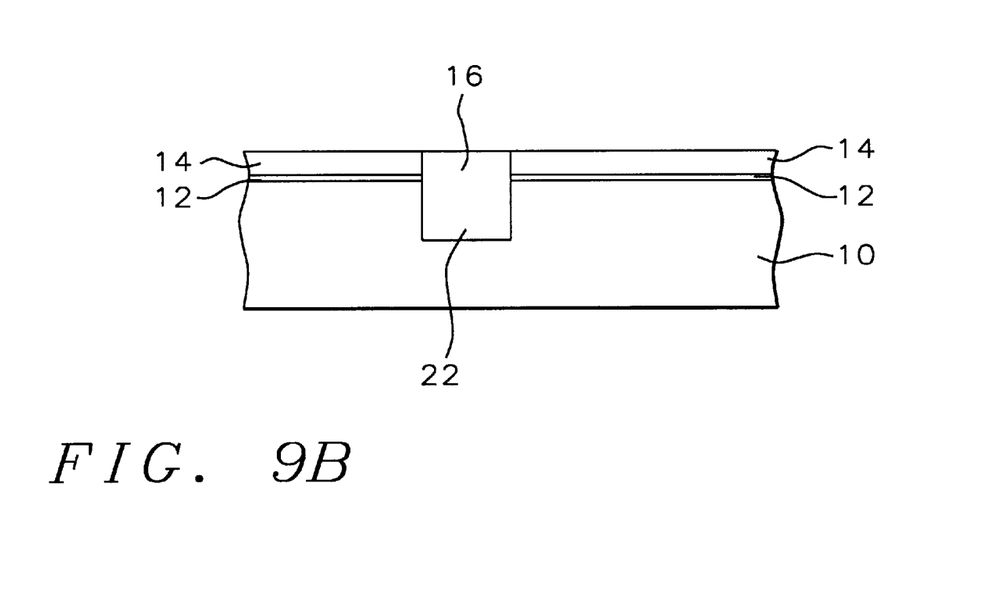
FIG. 9B shows a cross section view of the part of the active region of the wafer of FIG. 8B after the substrate has been planarized.
Figure 10:
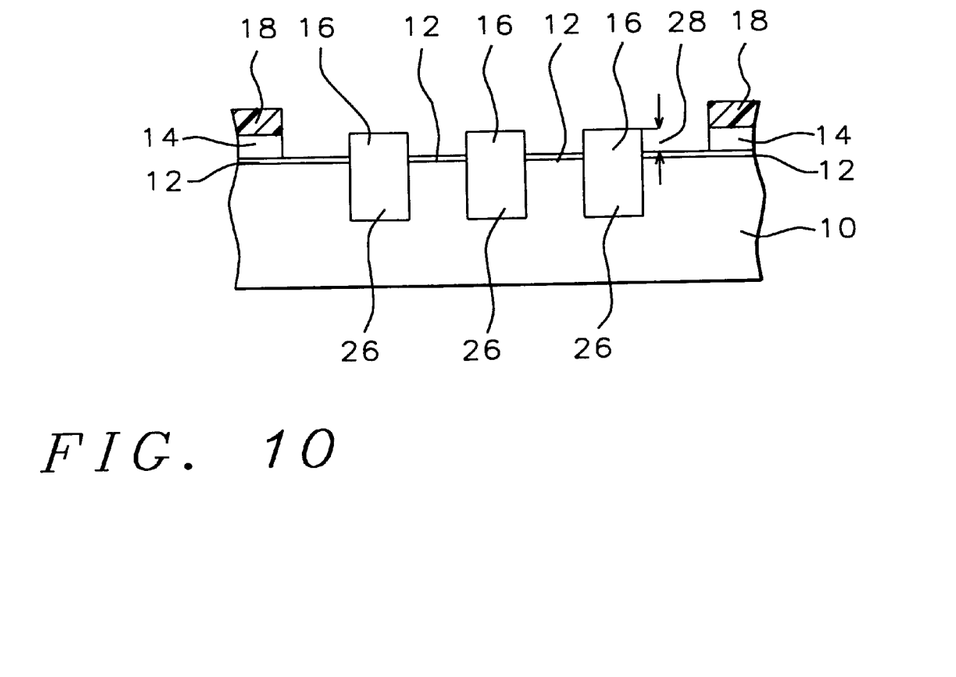
FIG. 10 shows a cross section view of the part of the auxiliary alignment region of the wafer of FIG. 9A after the layer of silicon nitride has been etched away thereby forming auxiliary alignment marks.
Figure 11:
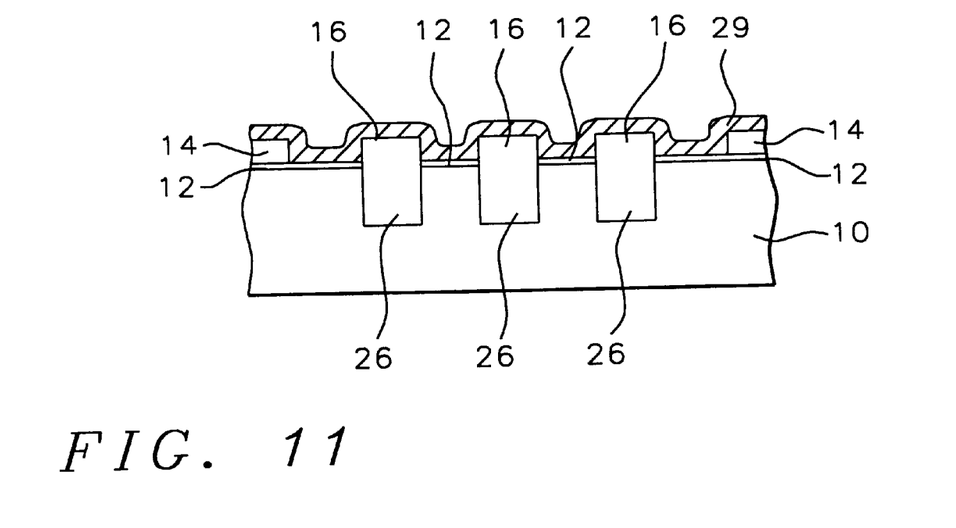
FIG. 11 shows a cross section view of the part of the auxiliary alignment region of the wafer of FIG. 10 after the layer of metal has been deposited over the auxiliary alignment marks.

As shown in FIGS. 8A and 8B the dielectric 16 is then etched back. The preferred point in the process for the dielectric etchback is during the reverse OD etch. If the dielectric etchback is done at other points of the process the device region must be covered by photoresist during the etchback. As shown in FIGS. 9A and 9B, the wafer is then planarized so that all the dielectric 16 above the plane of the top surface of the layer of silicon nitride 14 is removed. The planarization in this example is accomplished using chemical mechanical polishing. If any layers of opaque material, such as a layer of metal, were to be deposited at this time the alignment marks would be obscured. Next as shown in FIG. 10 that part of the layer of silicon nitride in the auxiliary alignment region is etched away leaving dielectric 16 in the alignment trenches 26 extending a step height 28 above the layer of pad oxide 12, thereby forming auxiliary alignment marks. A photoresist mask 17 is used to protect the rest of the wafer during this etching step. The photoresist mask is then stripped. As shown in FIG. 11 the auxiliary alignment marks can be used to align masks to the substrate even after the deposition of a layer of metal 29 or other opaque material. The step height in this example is between about 1000 and 2000 Angstroms.

As will be readily apparent to those skilled in the art the auxiliary alignment marks can also be formed in examples where isolation trenches are not formed. For this embodiment refer to FIGS. 3, 4, 5A, 6A, 7A, 8A, 9A, 10 and 11. In this embodiment the auxiliary alignment marks can be formed anywhere on the wafer but in this example they will be formed in the scribe lines 34, see FIG. 3. As in the preceding embodiment, FIG. 4 shows a cross section of a substrate 10, such as a silicon integrated circuit wafer, having a top surface. In this example a layer of pad oxide 12 is formed on the top surface of the substrate 10, however the invention may be used in cases where no pad oxide 12 layer is used. In this example the pad oxide is a layer of silicon oxide having a thickness of between about 100 and 120 Angstroms. A layer of silicon nitride, $Si_3N_4$, having a thickness of between about 1700 and 1800 Angstroms is formed on the layer of pad oxide 12. Next, as shown in FIG. 5A, a patterned layer of photoresist 14 is used as a mask to form openings for the alignment trenches in the layer of silicon nitride 14.

Next, as shown in FIG. 6A, the patterned layer of photoresist is stripped and openings are formed in the layer of pad oxide 12 and alignment trenches 26, having a depth 15 and a width 11, are formed in the substrate 10 using the patterned layer of silicon nitride 14 as a mask. Alternatively, the patterned layer of photoresist is left in place and openings are formed in the layer of pad oxide 12 and alignment trenches 26, having a depth 15 and a width 11, are formed in the substrate 10 using the patterned layer of photoresist and the patterned layer of silicon nitride 14 as a mask. The layer of photoresist is then stripped. The depth 15 of the alignment trenches is between about 2800 and 4200 Angstroms.

As shown in FIG. 7A, a layer of dielectric 16 having a first thickness is then formed on the wafer so that first dielectric completely fills the alignment trenches. The first thickness is determined by the width 11, see FIG. 6A, of the alignment trenches and is at least one half the width 11 of the alignment trenches or greater so that the dielectric 16 completely fills the alignment trenches 26. In this example the dielectric is silicon dioxide having a thickness of between about 5000 and 7000 Angstroms and deposited using low pressure chemical vapor deposition of tetraethyl orthosilicate or chemical vapor deposition of ozone and tetraethyl orthosilicate.

As shown in FIG. 8A the dielectric 16 is then etched back. As shown in FIG. 9A the wafer is then planarized so that all the dielectric 16 above the plane of the top surface of the layer of silicon nitride 14 is removed. The planarization in this example is accomplished using chemical mechanical polishing. Any layers of opaque material, such as a layer of metal, deposited at this time would obscure the alignment marks. Next as shown in FIG. 10 that part of the layer of silicon nitride in the auxiliary alignment region is etched away leaving dielectric 16 in the alignment trenches 26 extending a step height 28 above the layer of pad oxide 12, thereby forming auxiliary alignment marks. A photoresist mask 17 is used to protect the rest of the wafer during this etching step and then stripped. As shown in FIG. 11 the auxiliary alignment marks can be used to align masks to the substrate even after the deposition of a layer of metal 29 or other opaque material. The step height in this example is between about 1000 and 2000 Angstroms.

While the invention has been particularly shown and described with reference to the preferred embodiments thereof, it will be understood by those skilled in the art that various changes in form and details may be made without departing from the spirit and scope of the invention.

What is claimed is:

1. A method of preserving alignment marks, comprising the steps of:

providing a substrate having a top surface, active regions, auxiliary alignment regions, and primary alignment marks;

forming a layer of silicon nitride having a top surface on said substrate;

forming a layer of photoresist on said top surface of said layer of silicon nitride;

patterning said layer of photoresist;

patterning said layer of silicon nitride using said patterned layer of photoresist as a mask, thereby forming alignment trench openings in that part of said layer of silicon nitride directly over said auxiliary alignment regions of said substrate;

stripping said patterned layer of photoresist;

etching alignment trenches in said auxiliary alignment regions of said substrate, wherein said alignment trenches have a width and a depth;

forming a layer of dielectric having a first thickness on said substrate, wherein said first thickness is one half of the width of said alignment trenches or greater, thereby filling said alignment trenches with said dielectric;

planarizing said substrate thereby removing that part of said dielectric above the plane of said top surface of said layer of silicon nitride; and etching away said layer of silicon nitride from said auxiliary alignment regions of said substrate so that said dielectric in said alignment trenches extends a step height above the plane of said top surface of said substrate thereby forming dielectric alignment marks.

2. The method of claim 1 wherein said etching alignment trenches in said auxiliary alignment regions of said substrate uses said patterned layer of silicon nitride as a mask.

3. The method of claim 1 wherein said etching alignment trenches in said auxiliary alignment regions of said substrate uses said patterned layer of photoresist and said patterned layer of silicon nitride as a mask.

4. The method of claim 1 wherein said layer of silicon nitride has a thickness of between about 1700 and 1800 Angstroms.

5. The method of claim 1 wherein said depth of said alignment trenches is between about 2800 and 4200 Angstroms.

6. The method of claim 1 wherein said step height is between about 1000 and 2000 Angstroms.

7. The method of claim 1 wherein said auxiliary alignment regions of said substrate are located on said substrate scribe lines.

8. The method of claim 1 wherein said layer of dielectric is a layer of silicon dioxide and said first thickness is between about 5000 and 7000 Angstroms.

9. The method of claim 8 wherein said layer of silicon dioxide is deposited using low pressure chemical vapor deposition of tetraethyl orthosilicate.

10. The method of claim 8 wherein said layer of silicon dioxide is deposited using chemical vapor deposition of ozone and tetraethyl orthosilicate.

11. The method of claim 1 wherein said planarizing said substrate uses chemical mechanical polishing.

12. The method of claim 1 wherein a layer of pad oxide having a thickness of between about 100 and 120 Angstroms is formed on said substrate between said layer of silicon nitride and said top surface of said substrate.

13. The method of claim 1 wherein said substrate is a silicon integrated circuit wafer.

14. The method of claim 1 wherein said patterning said layer of silicon nitride uses said primary alignment marks to align said openings in said layer of silicon nitride.

15. A method of preserving alignment marks, comprising the steps of:

providing a substrate having a top surface, active regions, auxiliary alignment regions, and primary alignment marks;

forming a layer of pad oxide having on said top surface of said substrate;

forming a layer of silicon nitride having a top surface on said layer of pad oxide;

forming a layer of photoresist on said top surface of said layer of silicon nitride;

patterning said layer of photoresist;

patterning said layer of silicon nitride using said patterned layer of photoresist as a mask, thereby forming alignment trench openings in that part of said layer of silicon nitride directly over said auxiliary alignment regions of said substrate and isolation trench openings in that part of said layer of silicon nitride directly over said active regions of said substrate;

stripping said patterned layer of photoresist;

etching alignment trenches in said auxiliary alignment regions of said substrate, wherein said alignment trenches have a width and a depth;

etching isolation trenches in said active regions of said substrate;

forming a layer of dielectric having a first thickness on said substrate, wherein said first thickness is one half of said width of said alignment trenches or greater, thereby filling said alignment trenches and said isolation trenches with said dielectric;

planarizing said substrate thereby removing that part of said dielectric above the plane of said top surface of said layer of silicon nitride; and etching away said layer of silicon nitride from said auxiliary alignment regions of said substrate so that said dielectric in said alignment trenches of said substrate extends a step height above the plane of said top surface of said substrate thereby forming dielectric alignment masks.

16. The method of claim 15 wherein said etching alignment trenches in said auxiliary alignment regions of said substrate and said etching isolation trenches in said active regions of said substrate uses said patterned layer of silicon nitride as a mask.

17. The method of claim 15 wherein said etching alignment trenches in said auxiliary alignment regions of said substrate and said etching isolation trenches in said active regions of said substrate uses said patterned layer of photoresist and said patterned layer of silicon nitride as a mask.

18. The method of claim 15 wherein said layer of silicon nitride has a thickness of between about 1700 and 1800 Angstroms.

19. The method of claim 15 wherein said depth of said alignment trenches is between about 2800 and 4200 Angstroms.

20. The method of claim 15 wherein said step height is between about 1000 and 2000 Angstroms.

21. The method of claim 15 wherein said auxiliary alignment regions of said substrate are located on said substrate scribe lines.

22. The method of claim 15 wherein said layer of dielectric is a layer of silicon dioxide and said first thickness is between about 5000 and 7000 Angstroms.

23. The method of claim 22 wherein said layer of silicon dioxide is deposited using low pressure chemical vapor deposition of tetraethyl orthosilicate.

24. The method of claim 22 wherein said layer of silicon dioxide is deposited using chemical vapor deposition of ozone and tetraethyl orthosilicate.

25. The method of claim 15 wherein said planarizing said substrate uses chemical mechanical polishing.

26. The method of claim 15 wherein said layer of pad oxide has a thickness of between about 100 and 120 Angstroms.

27. The method of claim 15 wherein said substrate is a silicon integrated circuit wafer.

28. The method of claim 15 wherein said patterning said layer of silicon nitride uses said primary alignment marks to align said auxiliary alignment openings and said trench openings formed in said layer of silicon nitride.

29. The method of claim 15 wherein said etching said alignment trenches in said auxiliary alignment regions of said substrate and said etching said isolation trenches in said active regions of said substrate are accomplished during the same etching step.

* * * * *